United States Patent [19]
Cho et al.

[11] Patent Number: 5,530,906
[45] Date of Patent: Jun. 25, 1996

[54] CONTROL CIRCUIT RESPONSES TO A WAIT REQUEST FROM AN ADDRESS DECODER FOR CONTROLLING CLOCK SIGNAL SUPPLY TO A CPU TO OPERATE WITH SLOW PERIPHERAL

[75] Inventors: Yoshiki Cho; Shinichi Hirose, both of Itami, Japan

[73] Assignee: Mitsubishi Denki Kabushiki Kaisha, Tokyo, Japan

[21] Appl. No.: 357,564

[22] Filed: Dec. 16, 1994

Related U.S. Application Data

[63] Continuation of Ser. No. 138,568, Oct. 18, 1993, abandoned, which is a continuation of Ser. No. 500,816, Mar. 28, 1990, abandoned.

[30] Foreign Application Priority Data

Sep. 26, 1989 [JP] Japan ................. 1-249620

[51] Int. Cl.⁶ ................. G06F 1/04; G06F 1/12
[52] U.S. Cl. ................. 395/881; 395/878; 395/879; 395/550; 364/270.0; 364/270.3; 364/270.6; 364/DIG. 1; 364/271.5
[58] Field of Search ................. 395/275, 550, 395/425, 878, 879; 342/43; 327/141

[56] References Cited

U.S. PATENT DOCUMENTS

| | | | |
|---|---|---|---|
| 4,104,629 | 8/1978 | Isbister et al. | 342/43 |
| 4,507,732 | 3/1985 | Catiller et al. | 364/200 |
| 4,545,030 | 10/1985 | Kitchin | 364/900 |
| 4,558,409 | 12/1985 | Goss et al. | 364/200 |
| 4,631,702 | 12/1986 | Korba | 395/550 |
| 4,797,808 | 1/1989 | Bellay et al. | 364/200 |
| 4,819,164 | 4/1989 | Branson | 395/550 |
| 4,841,440 | 6/1989 | Yonezu et al. | 364/200 |
| 4,888,685 | 12/1989 | Morinaga et al. | 364/200 |
| 4,958,276 | 9/1990 | Kiuchi et al. | 395/425 |
| 4,970,418 | 11/1990 | Masterson | 327/141 |
| 4,975,593 | 12/1990 | Kurakazu et al. | 307/269 |
| 4,981,296 | 1/0191 | Shiraishi et al. | 364/200 |
| 5,021,950 | 6/1991 | Nishikawa | 364/200 |
| 5,083,266 | 1/1992 | Watanabe | 395/275 |
| 5,097,437 | 3/1992 | Larson | 395/775 |

FOREIGN PATENT DOCUMENTS 5325489  6/1989  Japan .

Primary Examiner—Thomas C. Lee
Assistant Examiner—Le Hien Luu
Attorney, Agent, or Firm—Townsend and Townsend and Crew

[57] ABSTRACT

A single-chip microcomputer (5) for controlling a peripheral circuit (7) having a constant process speed regardless of its process contents, is provided with a counter (2) for counting to a predetermined count so that a frequency of the clock signal is divided by the count and used as an operation clock for controlling the peripheral circuit.

5 Claims, 10 Drawing Sheets

5,530,906

CONTROL CIRCUIT RESPONSES TO A WAIT REQUEST FROM AN ADDRESS DECODER FOR CONTROLLING CLOCK SIGNAL SUPPLY TO A CPU TO OPERATE WITH SLOW PERIPHERAL

This is a continuation application of application Ser. No. 08/138,568 filed on Oct. 18, 1993 now abandoned, which is a continuation application of application Ser. No. 07/500,816 filed on Mar. 28, 1990 now abandoned.

BACKGROUND OF THE INVENTION

The present invention relates to a single-chip microcomputer for controlling peripheral circuits such as memories or dual port memories.

Japanese Patent Application Kokai No. 61-141,064 discloses that when a single-chip microcomputer of relatively high process speed accesses a peripheral circuit such as a read only memory (ROM) or random access memory (RAM), or a dual port memory, a wait time setting control circuit is added to the single-chip microcomputer to divide the frequency of a clock signal outputted from the microcomputer for permitting access with a clock signal of lower frequency. The wait time setting control circuit and address decoder must be made from a general purpose large scale integrated circuit, resulting in the increased mounting area.

SUMMARY OF THE INVENTION

Accordingly, it is an object of the invention to provide a single-chip microcomputer, which is equipped with peripheral circuits having different process times depending on the process contents and peripheral circuits having constant process times, with the minimum external circuit and thus the minimum mounting area.

According to the invention there is provided a single-chip microcomputer for outputting an address signal and a control signal to a peripheral circuit, exchanging data with the peripheral circuit, and receiving a wait request signal from the peripheral circuit, the microcomputer having a central processing unit, which includes a setting control circuit responsive to the wait request signal to output a control signal during a predetermined period; and an extension circuit responsive to the control signal to close its gate for blocking a clock signal from passing to the central processing unit.

Other objects, features, and advantages of the invention will be apparent from the following description when taken in conjunction with the accompanying drawings.

DESCRIPTION OF THE PREFERRED EMBODIMENT

Figure 1:
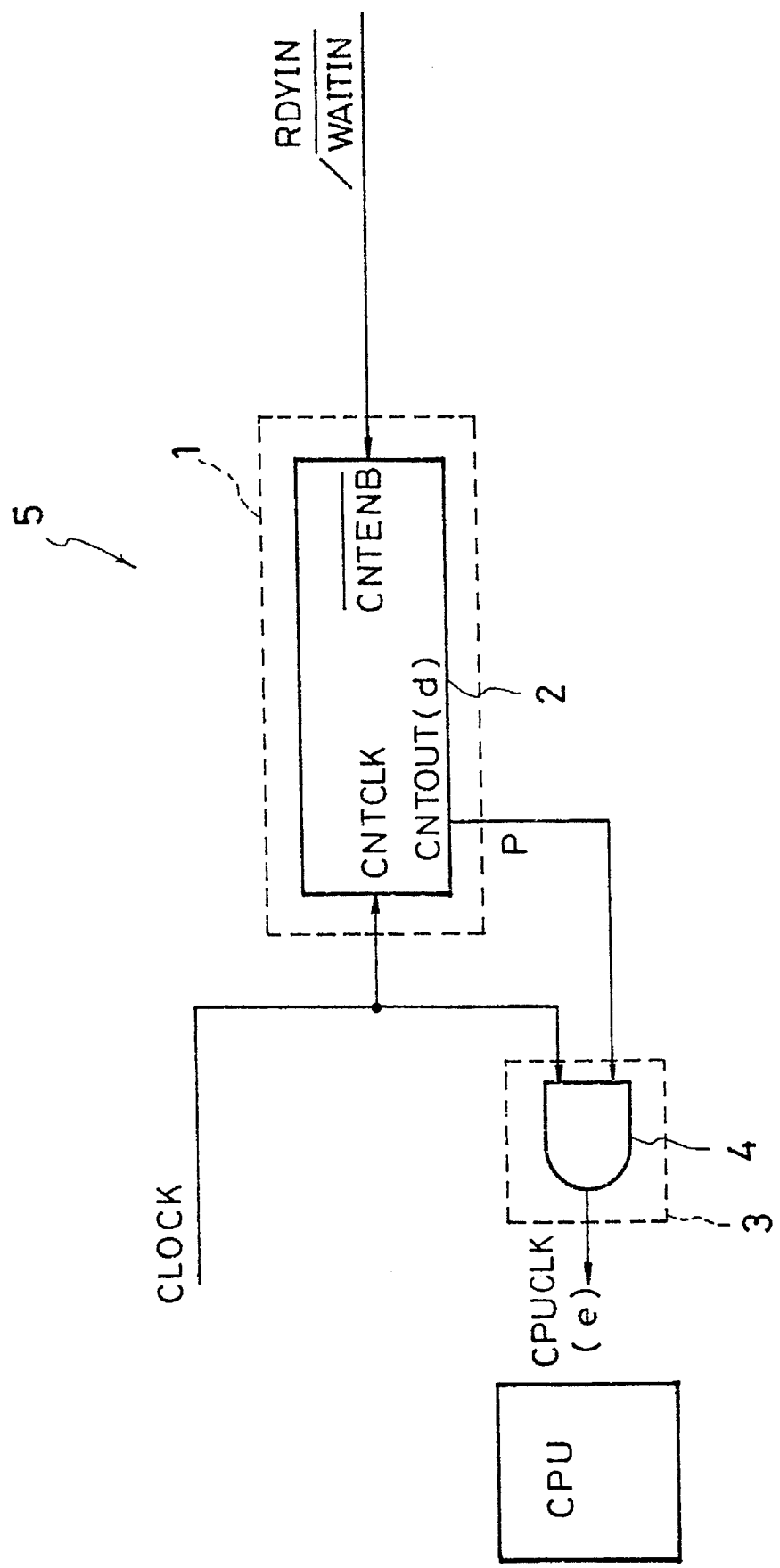
FIG. 1 is a schematic diagram of part of a single-chip microcomputer according to an embodiment of the invention.

In FIG. 1, the single-chip microcomputer 5 includes a wait time setting control circuit 1 which outputs a control signal P for a predetermined time in response to a wait request signal. The wait request signal is inputted to a wait input terminal RDYIN/$\overline{\text{WAITIN}}$. In response to the control signal P, an extension circuit 3 closes the gate to block a clock signal CLOCK from passing to a central processing unit (CPU). The clock signal CLOCK is inputted to the extension circuit 3, which consists of a 2-input AND gate 4, and the counter clock input terminal CNTCLK of the setting control circuit 1. The setting control circuit 1 consists of a 1-bit down counter 2. The wait request signal is inputted to the signal input terminal $\overline{\text{CNTENB}}$ of the 1-bit down counter 2. The output terminal CNTOUT of the 1-bit down counter 2 is connected to the input of the AND gate 4. The AND gate supplies a clock signal CPUCLK to the CPU.

Figure 2:
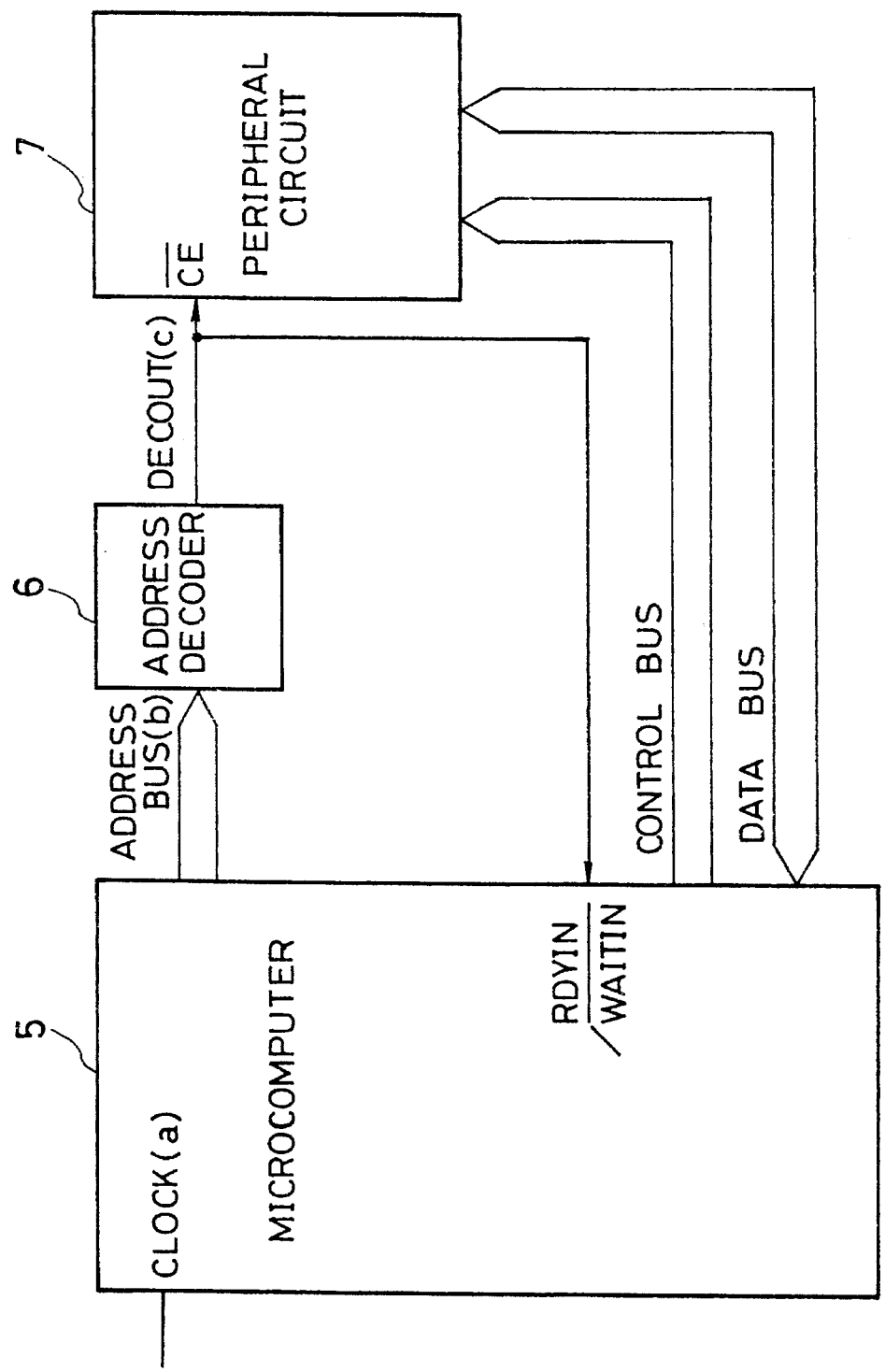
FIG. 2 is a block diagram of a system including the single-chip microcomputer of FIG. 1 and external circuits.

In FIG. 2, a peripheral circuit 7 operates at a constant process time regardless of the process contents and is used satisfactorily when the single-chip microcomputer 5 is put in the wait condition for one clock cycle. The microcomputer 5 outputs an address value on an address bus which is connected to an address decoder 6. The output DECOUT of the address decoder 6 is inputted to the enable signal input terminal $\overline{\text{CE}}$ of the peripheral circuit 7 and the wait input terminal RDYIN/$\overline{\text{WAITIN}}$ of the microcomputer 5. A data bus connects the microcomputer 5 and the peripheral circuit 7. A control bus connects the microcomputer 5 to the peripheral circuit 7.

Figure 3:
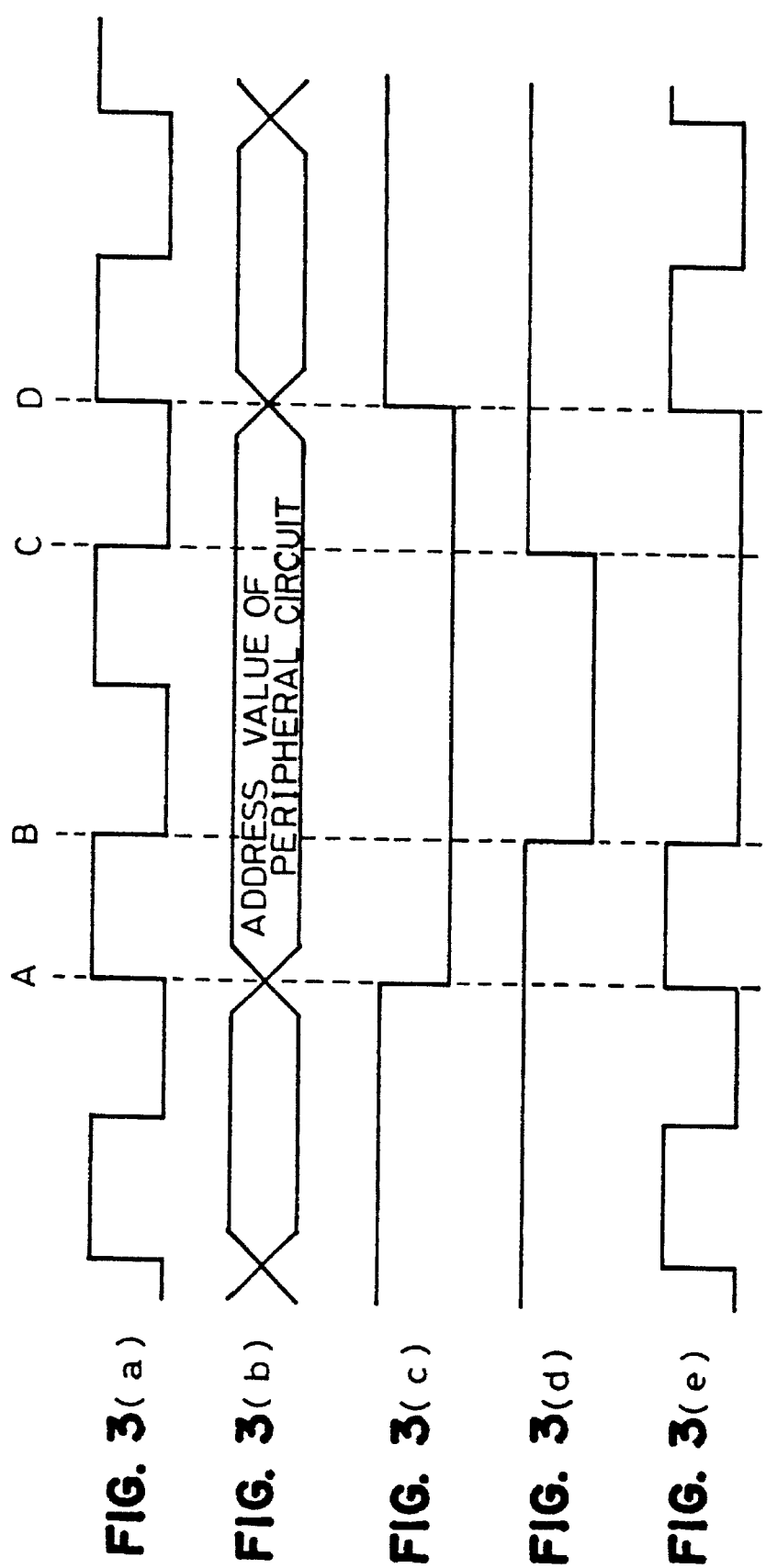
FIG. 3 is a timing chart showing the operation of the single-chip microcomputer of FIG. 1.

The operation will be described with reference to FIG. 3, wherein individual signals (a)–(e) represent CLOCK, address bus, DECOUT, CNTOUT, and CPUCLK, respectively. In order to select the peripheral circuit 7, the microcomputer 5 outputs at a time A an address value (b) which is allotted to the peripheral circuit 7. In response to the address value, the address decoder 6 outputs a low level signal "L" at the output terminal DECOUT (c) at the time A. The signal "L" is inputted to the input terminal $\overline{\text{CE}}$ of the peripheral circuit 7 to enable it. The signal "L" is also inputted to the input terminal RDYIN/$\overline{\text{WAITIN}}$ and thus $\overline{\text{CNTENB}}$ of the 1-bit down counter 2. Upon detection of the signal "L", the 1-bit down counter 2 down counts the clock signal from the microcomputer 5. The output signal at the output terminal CNTOUT (d) falls from "H" to "L" at a trailing edge B of the clock signal (a) and rises again to "H" at the next trailing edge C after one clock cycle. Then, the microcomputer 5 outputs at a time D another address value (b) for selecting another peripheral circuit. At the same time, the signal at the decoder output terminal DECOUT (c) becomes "H". The clock signal CLOCK (a) and the counter output signal CNTOUT (d) are ANDed to produce a CPU clock signal CPUCLK (e).

By synchronizing the address bus output, the data bus input/output, read/write control bus output with the period "L" of the CPU clock signal CPUCLK (e), the single-chip microcomputer 5 is able to use the peripheral circuit 7 which operates at lower speed than that of the original clock signal CLOCK.

Figure 4:
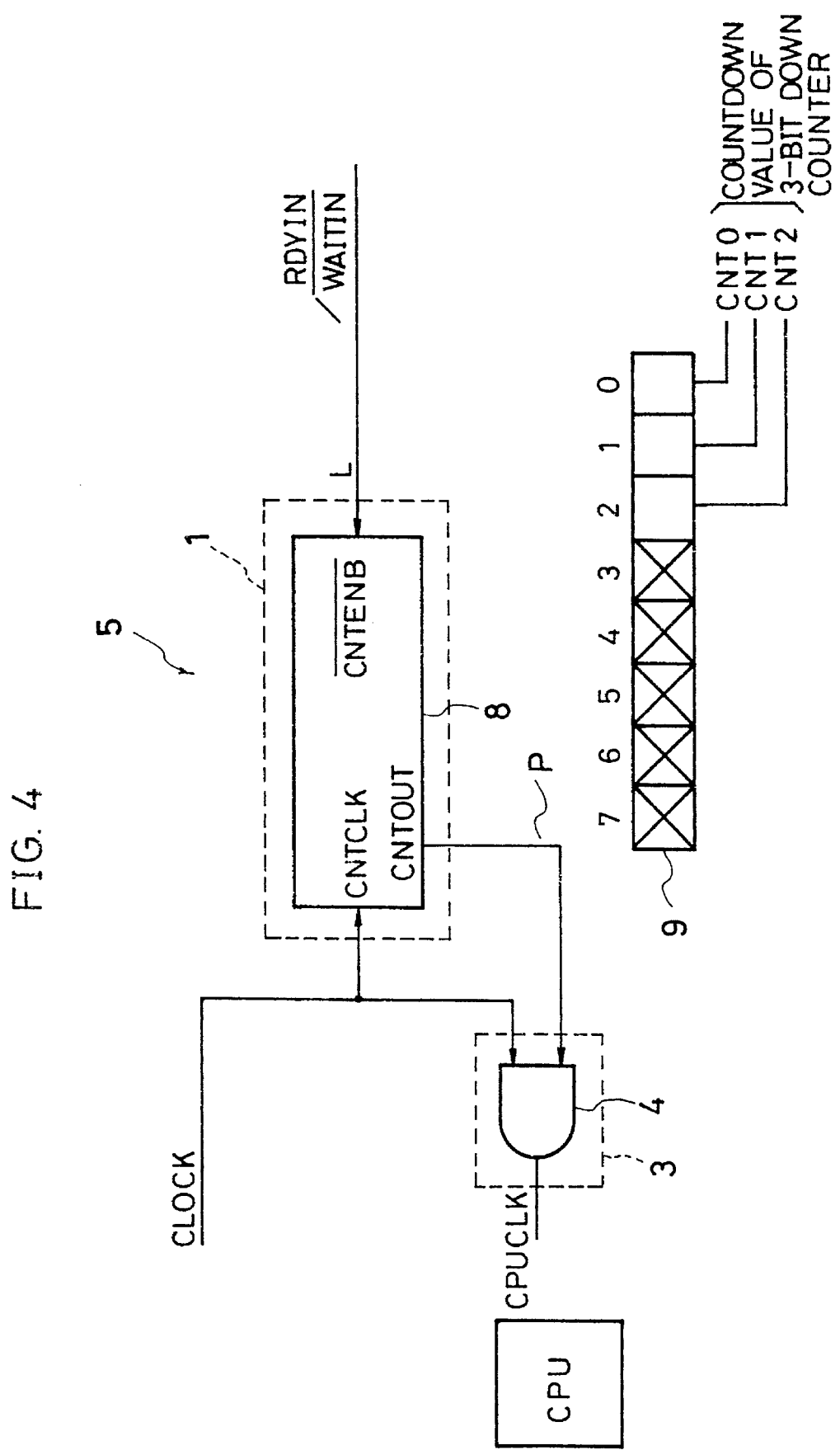
FIG. 4 is a schematic diagram of part of a single-chip microcomputer according to another embodiment of the invention.

In FIG. 4, the original clock signal CLOCK is inputted to the AND gate 4 of an extension circuit 3 and the setting control circuit 1. The countdown value is inputted to the input terminal CNTCLK of a 3-bit down counter 8. The signal RDYIN/WAITIN is inputted to the input terminal CNTENB of the 3-bit down counter 8. The output signal CNTOUT of the 3-bit down counter is inputted to the 2-input AND gate 4, which outputs a clock signal CPUCLK to the CPU. The single-chip microcomputer 5 further includes a setting register 9 for setting with software the countdown value for the 3-bit down counter 8. In other words, it is possible to change the setting of a countdown value for the down counter 8.

This single-chip microcomputer 5 is useful for the same system as that of FIG. 2, wherein the peripheral circuit 7 operates at a constant process time regardless of the process contents and is used satisfactorily when the microcomputer 5 is put in the wait state for a multiple of the clock cycles up to 8 cycles ($=2^3$). The microcomputer 5 outputs an address value on the address bus to the address decoder 6. The output signal DECOUT is inputted to the input terminal $\overline{CE}$ of the peripheral circuit 7 and the wait input terminal RDYIN/WAITIN of the microcomputer 5. A data bus connects the microcomputer 5 and the peripheral circuit 7. A control bus connects the microcomputer 5 to the peripheral circuit 7.

Figure 5:
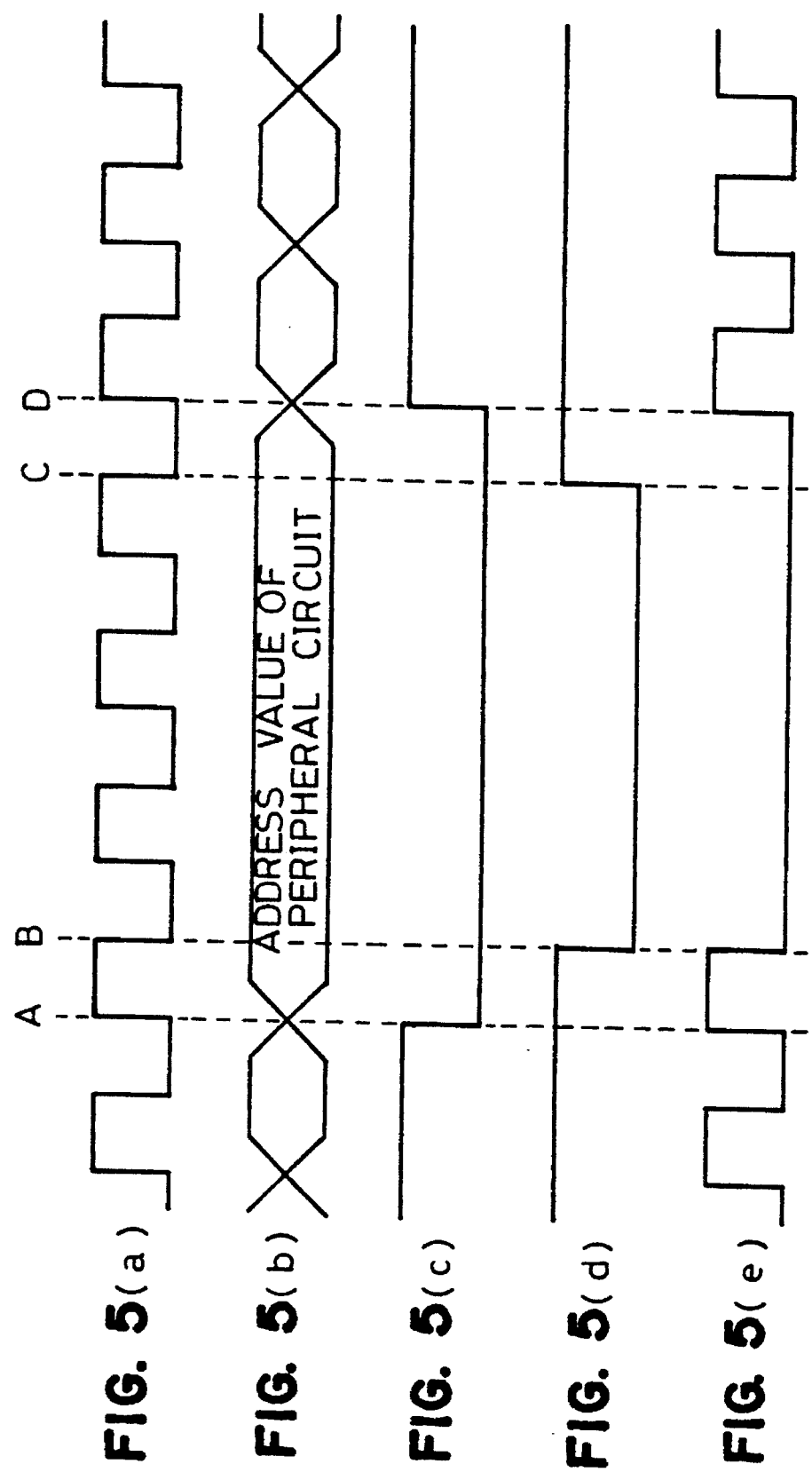
FIG. 5 is a timing chart showing the operation of the single-chip microcomputer of FIG. 4.

The operation will be described with reference to FIG. 5. It is assumed that the downcount value of a setting register 9 is set by software at 3 or "011". In order to select the peripheral circuit 7, the microcomputer 5 outputs at a time A an address value (b) to which the peripheral circuit 7 is allotted. In response to the address value, the address decoder 6 outputs at the output terminal DECOUT (c) at the time A a low-level signal "L" to the input terminal $\overline{CE}$ of the peripheral circuit 7 to enable it. The signal "L" is also inputted to the input terminal $\overline{CNTENB}$ of the 3-bit down counter 8. Upon detecting that the counter enable signal CNTENB becomes "L", the 3-bit down counter 8 down counts the clock signal CLOCK inputted to the input terminal CNTCLK from the microcomputer 5. The output signal CNTOUT (d) of the 3-bit down counter 8 falls from "H" to "L" at a time B and rises again to "H" at a time C after 3 cycles of the original clock in this case. Then, the microcomputer 5 outputs another address value (b) at a time D for another peripheral circuit. At the same time, the decoder output DECOUT (c) rises to "H". The CPU clock signal CPUCLK (e) is the logical product of the clock signal CLOCK (a) and the counter output signal CNTOUT (d).

Thus, by synchronizing the address bus output, the data bus input/output, the control bus read/write output with the period "L" of the CPU clock signal CPUCLK, the single-chip microcomputer 5 is able to use the peripheral circuit 7 which operates at lower speed than that of the original clock. In addition, by writing with software another value, such as 4 or "100", in the setting register 9 to change the downcount value, it is possible to set the wait time of the microcomputer 5 according to the process speed of the peripheral circuit 7.

Figure 6:
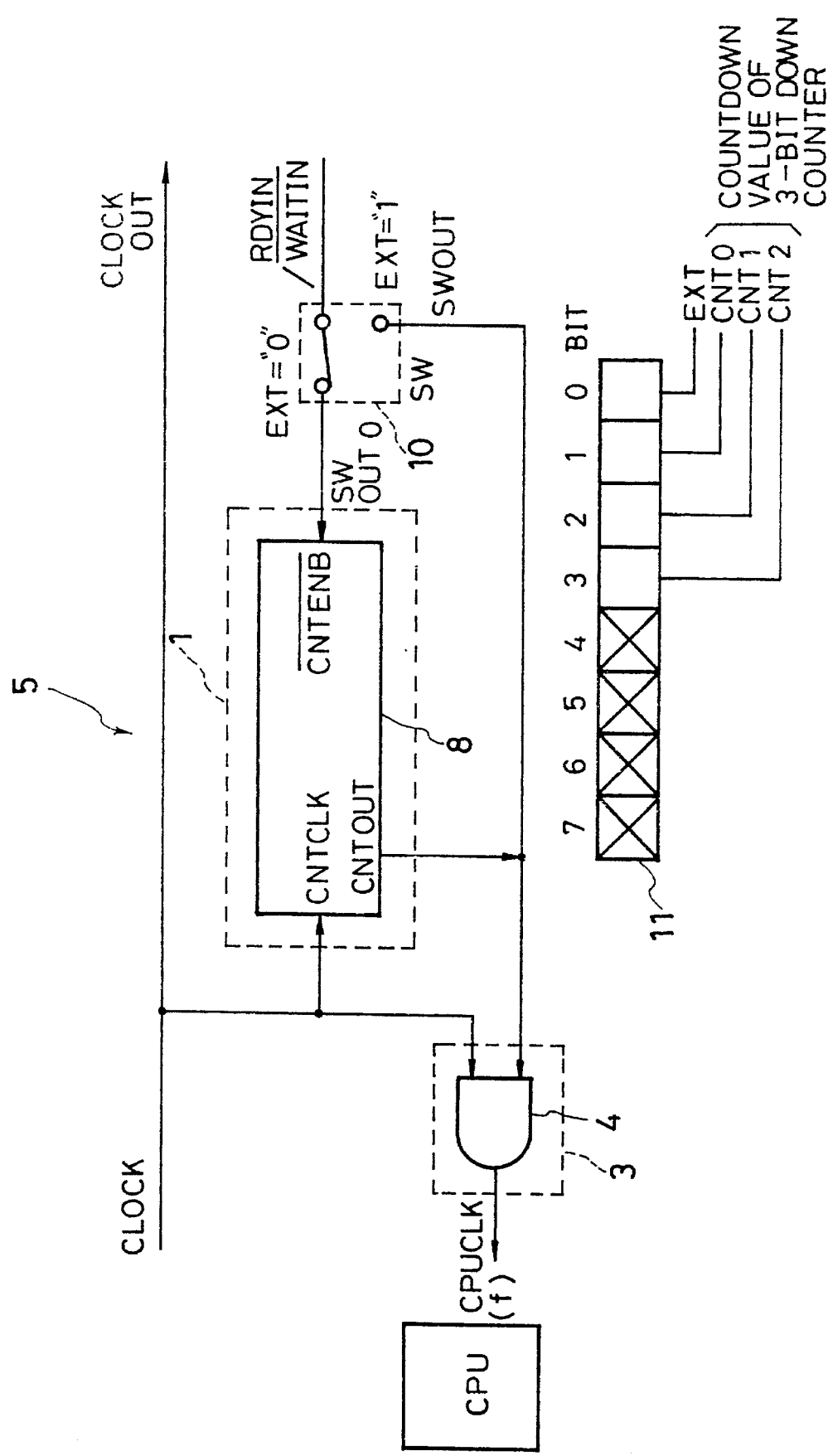
FIG. 6 is a schematic diagram of part of a single-chip microcomputer according to still another embodiment of the invention.

In FIG. 6, the original clock signal CLOCK is inputted to the output terminal CLOCKOUT, the 2-input AND gate 4, and the input terminal CNTCLK of a 3-bit down counter 8 in the setting control circuit 1. The input signal RDYIN/WAITIN is inputted to a switch SW 10 which is incorporated in the single-chip microcomputer 5. An output terminal SWOUT0 of the switch 10 is connected to the input terminal $\overline{CNTENB}$ of the 3-bit down counter 8. The output terminal CNTOUT of the 3-bit down counter 8 is connected to the output terminal SWOUT1 of the switch 10 and the input of the AND gate 4. The output signal of the AND gate 4 is inputted to the CPU as a CPU clock signal CPUCLK. The microcomputer 5 also has a setting register 11 for setting with software a countdown value of the 3-bit down counter 8 and an output of the switch 10.

This microcomputer 5 is also useful for the peripheral circuit 7 in the system of FIG. 2 when it is put in the wait condition for a multiple of clock cycles up to 8 cycles ($=2^3$). In FIG. 2, the single-chip microcomputer 5 outputs an address value on the address bus to the address decoder 6. The output signal DECOUT of the address decoder 6 is inputted to the input terminal $\overline{CE}$ of the peripheral circuit 7 and the input terminal RDYIN/WAITIN of the microcomputer 5.

In operation, it is assumed that the downcourt value of the down counter 8 and the output value of the switch 10 are set with software at 3 and 0, respectively, or "0110" as shown in FIG. 6. This setting makes the circuit identical with that of FIG. 4 and, therefore, the description of its operation will be omitted.

Next, by using software, the contents of the setting register 11 are set at "XXX1" wherein X is either 0 or 1. Since the bit 0 has a value of 1, the input signal RDYIN/WAITIN of the microcomputer 5 is inputted directly to the 2-input AND gate 4. Where the CPUCLK is made "L" during the entire period in which the address decoder 6 outputs an address value, the switch 10 is turned to the SWOUT1 with software to thereby supply the input signal RDYIN/WAITIN directly to the extension circuit 3.

Figure 7:
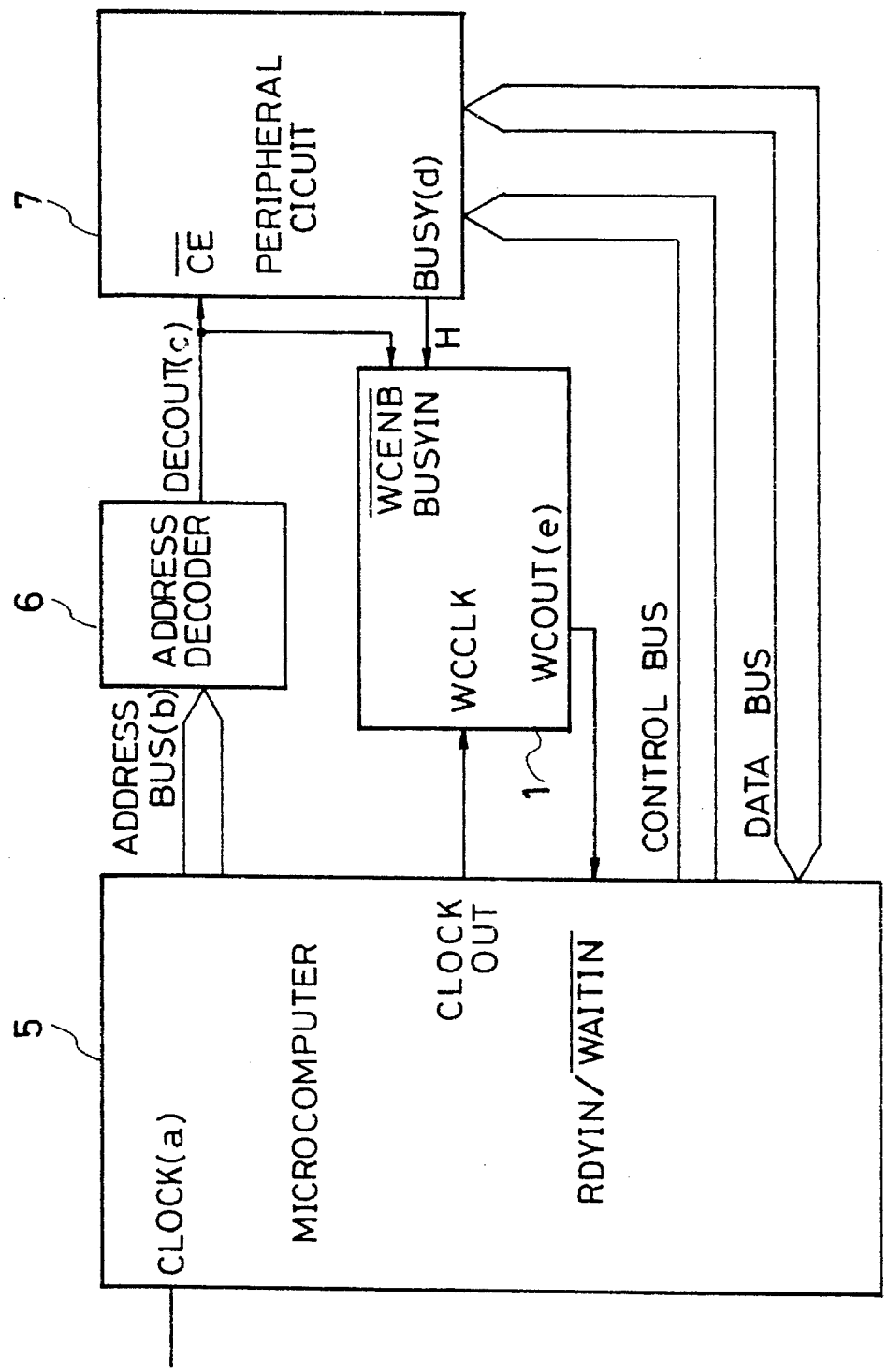
FIG. 7 is a block diagram of a system including the single-chip microcomputer of FIG. 6 and external circuits.

In FIG. 7, the process speed of a peripheral circuit 7 varies with its processing contents. Where the single-chip microcomputer 5 uses this peripheral circuit 7, the microcomputer 5 must wait until the peripheral circuit 7 completes its process. The microcomputer 5 outputs an address value on the address bus to the address decoder 6. The output terminal DECOUT is connected to the input terminal $\overline{CE}$ of the peripheral circuit 7 and the input terminal $\overline{WCENB}$ of the setting control circuit 1. The peripheral circuit 7 outputs at the output terminal BUSY a busy signal H, which is inputted to the input terminal BUSYIN of the setting control circuit 1. The clock signal is inputted to the input terminal WCCLK of the setting control circuit 1 from the output terminal CLOCKOUT of the microcomputer 5. The output terminal WCOUT of the setting control circuit 1 is connected to the input terminal RDYIN/WAITIN of the microcomputer 5. A data bus connects the microcomputer 5 and the peripheral circuit 7. A control bus connects the microcomputer 5 to the peripheral circuit 7.

Figure 8:
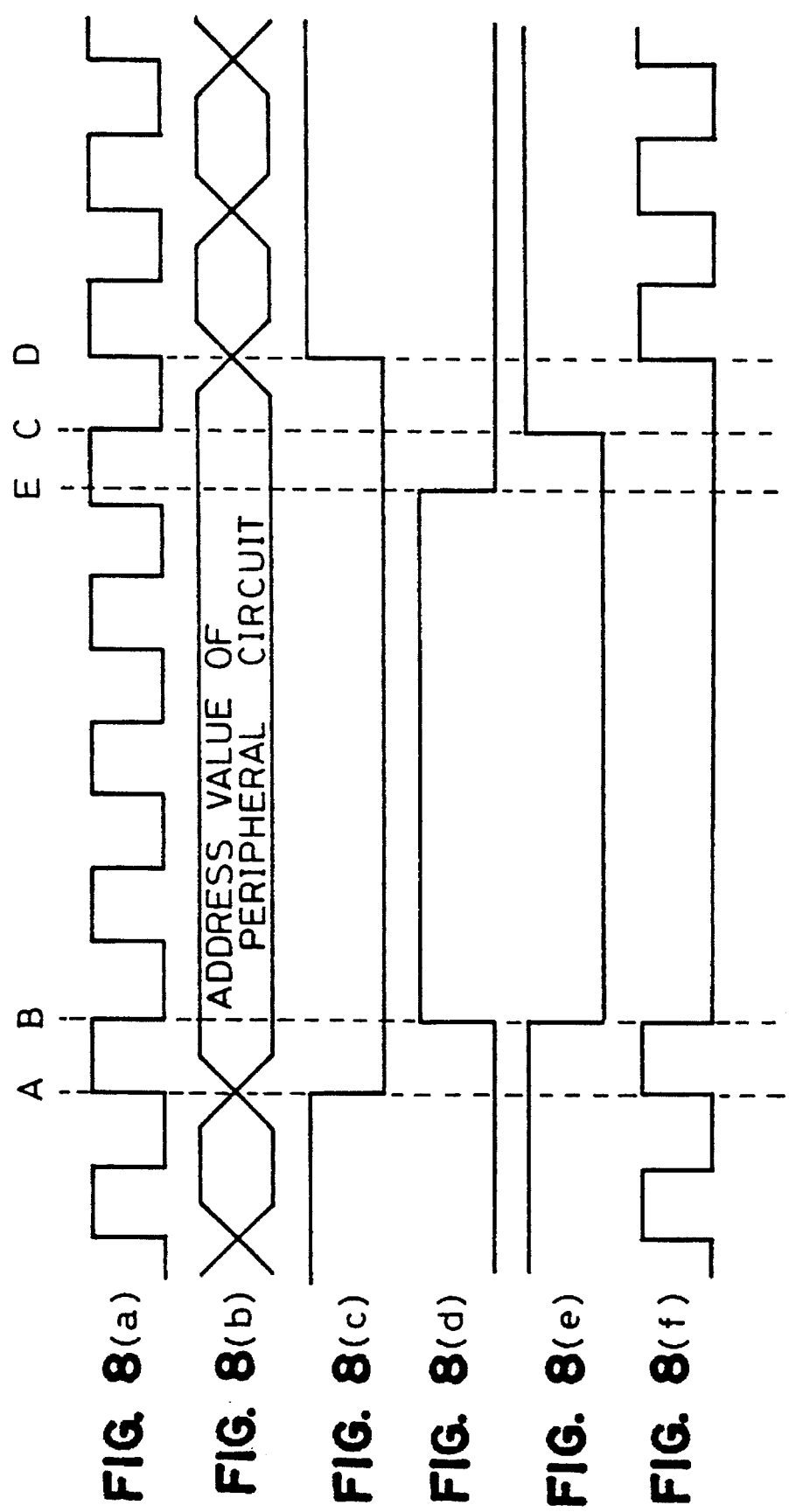
FIG. 8 is a timing chart showing the operation of the single-chip microcomputer of FIG. 6.

The operation of the system of FIG. 7 will be described with reference to FIG. 8. In order to select the peripheral circuit 7, the microcomputer 5 outputs at a time A on the address bus (b) an address value to which the peripheral circuit 7 is allotted. In response to the address value, the address decoder 6 outputs at the time A at the output terminal DECOUT (c) a low-level signal "L", which is inputted to the input terminal $\overline{CE}$ of the peripheral circuit to enable it. The signal "L" from the decoder output DECOUT is also inputted to the input terminal $\overline{WCENB}$ of the setting control circuit 1. The peripheral circuit 7 outputs a high-level signal "H" at the output terminal BUSY (d) at a trailing edge B of the clock signal (a). Upon detecting that the busy signal (BUSY) is at "H", the setting control circuit 1 outputs a low-level signal "L" at the output terminal WCOUT (e) at the time B.

Then, the peripheral circuit 7 completes its process, and the BUSY signal (d) changes from "H" to "L" at a time E, the output signal WCOUT (e) of the setting control circuit 1 becomes "H" at a trailing edge C of the next clock pulse (a). Then, the microcomputer 5 outputs another address value (b) at a time D to select another peripheral circuit. At the same time, the decoder output DECOUT (c) becomes "H". The clock signal CLOCK (a) and the output signal WCOUT (e) are ANDed in the microcomputer 5 using the circuitry of FIG. 6 to produce a CPU clock signal CPUCLK (f). That is, the period of a bus cycle is extended while the input RDYIN/WAITIN to the microcomputer 5 is at "L".

Figure 9:
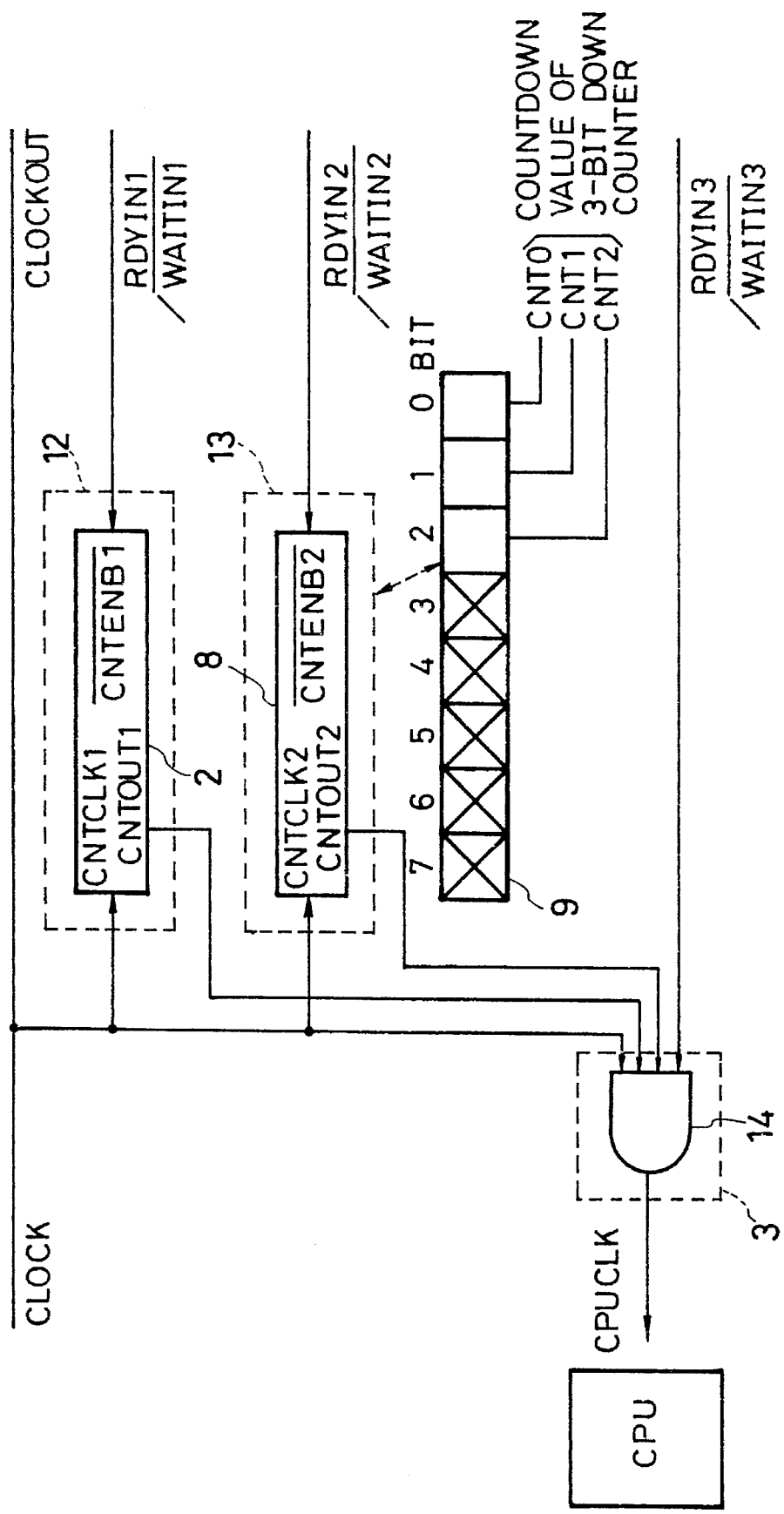
FIG. 9 is a schematic diagram of part of a single-chip microcomputer according to yet another embodiment of the invention.

In FIG. 9, the setting control circuits 1 of FIGS. 1 and 4 are provided in parallel at 12 and 13 respectively. The clock signal CLOCK is inputted to a 4-input AND gate 14 of an extension circuit 3 and the respective setting control circuits 12 and 13. The setting control circuit 12 consists of a 1-bit down counter 2 in which the countdown value is fixed at "1". The setting control circuit 13 consists of a 3-bit down counter 8 in which different countdown values are set by software with the setting register 9. More specifically, the clock signal CLOCK is inputted to the input terminal CNTCLK 1 of the 1-bit down counter 2, the input terminal CNTCLK 2 of the 3-bit down counter 8, and the 4-input AND gate 14. Wait signals RDYIN1/WAITIN1 and RDYIN2/WAITIN2 are inputted to the input terminal CNTENB1 of the 1-bit down counter 2 and the input terminal CNTENB2 of the 3-bit down counter 8 respectively. Another wait signal RDYIN3/WAITIN3 is inputted to the 4-input AND gate 14. By setting the contents of the setting register 9 with software, it is possible to set eight ($2^3$=8) different countdown values of the 3-bit down counter 8. The output signal of the AND gate 14 is inputted to the CPU as a CPU clock signal CPUCLK. That is, the setting register 9, the setting circuits 12 and 13, and input terminals RDYIN1/WAITIN1, RDYIN2/WAITIN2, RDYIN3/WAITIN3 are arranged so as to process three inputs to thereby enable the microcomputer to use peripheral circuits of various process speed.

Figure 10:
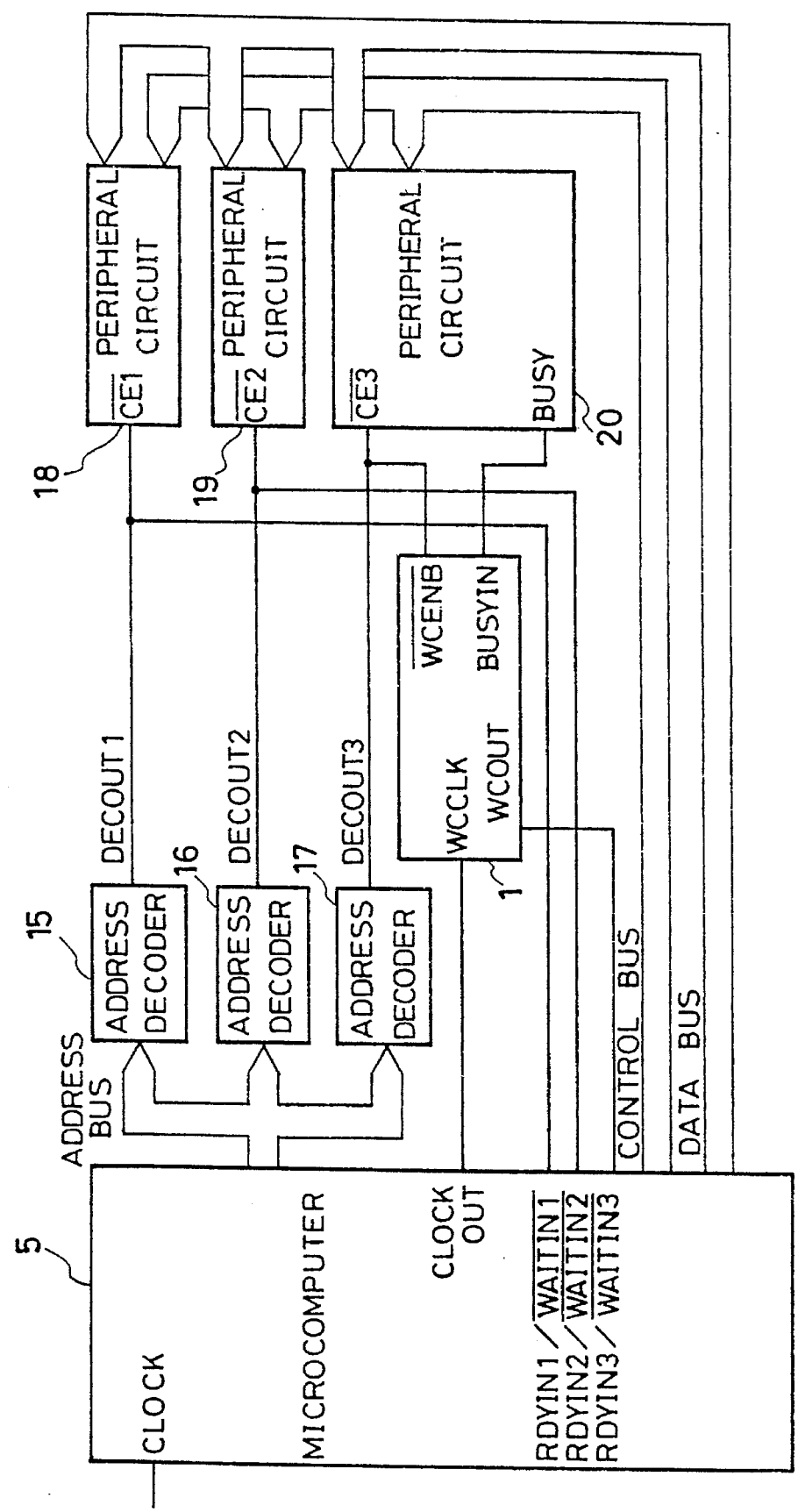
FIG. 10 is a block diagram of a system including the single-chip microcomputer of FIG. 9 and external circuits.

For example, the microcomputer 5 is able to use three peripheral circuits 18, 19, and 20 as shown in FIG. 10, wherein the peripheral circuits 18 and 19 have different process times which are constant regardless of the process contents, and the peripheral circuit 20 has different process times depending on its process contents. The microcomputer 5 outputs address values on the address bus to the address decoders 15, 16, and 17. The respective output signals DECOUT1, DECOUT2, and DECOUT3 from the address decoders 15–17 are inputted to the input terminals $\overline{CE1}$, $\overline{CE2}$, and $\overline{CE3}$ of the peripheral circuits 18–20. The two output signals DECOUT1 and DECOUT2 are also inputted to the input terminal RDYIN1/$\overline{WAITIN1}$ and RDYIN2/$\overline{WAITIN2}$ of the microcomputer 5. The output signal DECOUT3 of the address decoder 17 is also inputted to the input terminal $\overline{WCENB}$ of the setting control circuit 1. The busy signal BUSY indicating that the peripheral circuit 20 is in process is inputted to the setting control circuit 1, and a clock signal is inputted to the input terminal WCCLK from the output terminal CLOCKOUT of the microcomputer 5. The output signal WCOUT of the setting control circuit 1 is inputted to the input terminal RDYIN3/$\overline{WAITIN3}$ of the microcomputer 5. A data bus connects the microcomputer 5 and the peripheral circuits 18, 19, and 20. A control bus connects the microcomputer 5 to the peripheral circuits 18, 19, and 20.

In operation, when the microcomputer 5 outputs on the address bus an address value to which the peripheral circuit 18 is allotted, only the address decoder 15 outputs a low-level signal "L" to the input terminal $\overline{CE1}$ of the peripheral circuit 18 and the input terminal RDYIN1/$\overline{WAITIN1}$ of the microcomputer 5 to enable the 1-bit down counter 2 within the microcomputer 5. The circuit and operation under this enable condition are identical with those of FIGS. 1 and 3 and, therefore, their detailed description will be omitted.

When the microcomputer 5 outputs on the address bus an address value to which the peripheral circuit 19 is allotted, only the address decoder 16 outputs a low-level signal "L" to the input terminal $\overline{CE2}$ of the peripheral circuit 19 and the input terminal RDYIN2/$\overline{WAITIN2}$ of the microcomputer 5 to enable the 3-bit down counter 8. The circuit and operation under this enable condition are identical with those of FIGS. 4 and 5 and, therefore, their detailed description will be omitted.

When the microcomputer 5 outputs on the address bus an address value to which the peripheral circuit 20 is allotted, only the address decoder 17 outputs a low-level signal "L" to the input terminal $\overline{CE3}$ of the peripheral circuit 20 and the input terminal $\overline{WCENB}$ of the setting control circuit 1. The circuit and operation under this condition are identical with those of FIGS. 6 and 8 and, therefore, their detailed description will be omitted.

That is, when the microcomputer 5 uses the peripheral circuits 18 and 19 having a constant process time regardless of the process contents and the peripheral circuit 20 having different process times depending on its process contents, it is possible to minimize the external add-on circuit to thereby minimize not only the mounting area on a board but also the wait time of the microcomputer according to the individual peripheral circuits.

As has been described above, according to an embodiment of the invention, the single-chip microcomputer, which has a central processing unit, a wait input terminal, a clock signal input terminal, an address output terminal, a data i/o terminal, and a control output terminal, is provided with a wait time setting control circuit which outputs a control signal for extending the bus cycle to a wait time predetermined by software or hardware when the signal inputted to the wait input terminal is found at a predetermined level at a certain time within one bus cycle and a bus cycle time extension circuit which receives an output signal of the setting control circuit and the original clock signal and outputs a CPU clock signal of a prolonged bus cycle, whereby the external wait time setting control circuit is eliminated, resulting in the small mounting area.

According to another embodiment of the invention, the single-chip microcomputer, which has a central process unit, a wait input terminal, a clock signal input terminal, a clock signal output terminal, an address output terminal, a data i/o terminal, and a control signal output terminal, is provided with a wait input switch which receives a wait signal and switches between two outputs; a wait setting control circuit which outputs a control signal for extending the bus cycle to a wait time predetermined by software or hardware when the signal inputted to the input terminal is found at a predetermined signal level at a certain time within one bus cycle; a bus cycle extension circuit which receives an output signal of the wait setting control circuit, an output signal of the wait input switch, and the clock signal and outputs a CPU clock signal of a prolonged bus cycle; and a setting register for setting a wait time of the wait setting control circuit where the wait time is set by software, whereby the external circuit is minimized when the single-chip microcomputer uses either a peripheral circuit which has a process time varying with its process contents or a peripheral circuit which has a constant process time regardless of its process contents, resulting in the small mounting area.

The wait time required to use the peripheral circuit is also minimized. That is, the wait input switch switches its outputs to select the best setting control circuit for the peripheral circuit to be used. As a result, it is sufficient to use a minimum external circuit, resulting in the small mounting area. In addition, it is possible to use the peripheral circuit with the shortest wait time.

According to still another embodiment of the invention, the single-chip microcomputer, which has a central processing unit, a plurality of wait input terminals, a clock signal input terminal, a clock signal output terminal, an address output terminal, a data i/o terminal, and a control signal output terminal, is provided with at least one setting control circuit which outputs a control signal for extending the bus cycle to a wait time predetermined by software or hardware when one of the wait signals inputted to the wait input terminals is found at a predetermined level at a certain time within one bus cycle and a bus cycle extension circuit which receives one of the wait input signals, all the output signals of the setting control circuit, and the clock signal to extend the duration of a bus cycle, whereby the external circuit is minimized where the single-chip microcomputer uses a plurality of peripheral circuits having different process times depending on the process contents and peripheral circuits having constant process times regardless of the process contents, resulting in the small mounting area.

Since the setting control circuit is incorporated in the single-chip microcomputer, once a low-level signal "L" is inputted to the input terminal RDYIN/$\overline{\text{WAITIN}}$, it is not necessary to detect the value of the above signal (it is not necessary for the signal to be "L") until the setting control circuit or counter (delay circuit) is overflown (wait is completed), whereby the counter of the single-chip microcomputer is able to control the CPU wait time. This indicates small signal changes outside the chip, thus reducing the possibility of noise generation.

We claim:

1. A single-chip microcomputer comprising:
   a central processing unit (CPU),
   a clock signal input terminal for receiving a clock signal supplied by a source;
   an address signal output terminal for outputting an address signal from the CPU, for specifying a peripheral circuit, to a plurality of address decoders provided respectively corresponding to peripheral circuits;
   wait request signal input terminals connected in parallel to respective signal lines for connecting the plurality of address decoders to the peripheral circuits to receive an effective signal from one of the address decoders operative in response to the address signal to a peripheral circuit as a wait request signal; and
   a control circuit, operative in response to the wait request signal, for controlling supply of the clock signal to the CPU to cancel the difference of operation speed between the CPU and the peripheral circuit which is effective with the effective signal, wherein the CPU generates an address signal for making the next peripheral circuit effective in synchronism with the clock signal when the control circuit resumes supply of the clock signal.

2. The single-chip microcomputer of claim 1, wherein the control circuit comprises counter means and gate means;
   said counter means including a first input terminal for receiving the wait request signal, a second input terminal for receiving the clock signal supplied by the source, and a gate control signal output terminal for outputting a gate control signal to said gate means at a time when a predetermined count value of the clock signal is counted after the wait request signal is input; and
   said gate means including input terminals for receiving the clock signal and the gate control signal, for prohibiting supply of the clock signal to the CPU during the gate control signal is input.

3. The single-chip microcomputer of claim 2 which further comprises a register for changing a count value of said counter means with software.

4. The single-chip microcomputer of claim 3 which further comprises a switching circuit for selecting which the wait request signal is supplied directly to said gate means or said counter means.

5. A data processing system comprising:
   an address bus;
   a plurality of address decoders coupled to said address bus, with each address decoder for asserting a decout signal at an output port when a unique address corresponding to a selected address decoder in said plurality is asserted on said address bus;
   a plurality of peripheral circuits, each peripheral circuit in said plurality having an enable input port coupled to the output port of a corresponding address decoder in said plurality so that each peripheral circuit is specified by a unique address asserted on said address bus;
   a single chip microcomputer including:
      a central processing unit (CPU),
      a clock signal input terminal for receiving a clock signal supplied by a source;
      an address signal output terminal, coupled to said address bus and to said CPU, for outputting an address signal from the CPU and asserting said address signal on said address bus to specify a peripheral circuit;
      a plurality of wait request signal input terminals connected in parallel to the output terminals of respective address decoders, with each wait signal input terminal in said plurality for receiving an asserted decout signal from the respective address decoder as a wait request signal when an address signal selecting the decoder is asserted on the address bus;
      a control circuit, operative in response to a received wait request signal and coupled to said CPU and said clock input terminal, for controlling supply of the clock signal to the CPU to cancel the difference of operation speed between the CPU and the peripheral circuit specified by the address signal asserted on the address bus, wherein the CPU generates an address signal for making a next peripheral circuit effective in synchronism with the clock signal when the control circuit resumes supply of the clock signal.

* * * * *